(12) United States Patent
Matsuo (10) Patent No.: US 7,402,903 B2
(45) Date of Patent: Jul. 22, 2008

(54) SEMICONDUCTOR DEVICE

(75) Inventor: Mie Matsuo, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/759,183

(22) Filed: Jan. 20, 2004

(65) Prior Publication Data

US 2004/0262767 A1    Dec. 30, 2004

(30) Foreign Application Priority Data

Jan. 22, 2003    (JP) ............................ P2003-013919

(51) Int. Cl.
*H01L 23/04* (2006.01)
(52) U.S. Cl. ................. 257/698; 257/686; 257/E25.013
(58) Field of Classification Search .................. 257/774, 257/758
See application file for complete search history.

(56) References Cited

U.S. PATENT DOCUMENTS

| 5,424,245 | A | | 6/1995 | Gurtler et al. | |
|---|---|---|---|---|---|
| 6,166,425 | A | * | 12/2000 | Sakao | 257/538 |
| 2001/0045605 | A1 | * | 11/2001 | Miyashita et al. | 257/382 |
| 2002/0079492 | A1 | * | 6/2002 | Koga | 257/66 |
| 2002/0079525 | A1 | * | 6/2002 | Mayuzumi | 257/296 |
| 2002/0084513 | A1 | * | 7/2002 | Siniaguine | 257/621 |
| 2002/0115226 | A1 | * | 8/2002 | Mikawa et al. | 438/3 |
| 2002/0190375 | A1 | * | 12/2002 | Mashino et al. | 257/734 |
| 2003/0210534 | A1 | * | 11/2003 | Swan et al. | 361/807 |

FOREIGN PATENT DOCUMENTS

| JP | 10-223833 | 8/1998 |
|---|---|---|
| JP | 11-195706 | 7/1999 |
| JP | 2003-203914 | 7/2003 |

OTHER PUBLICATIONS

Nobuo Hayasaka, et al.; Multichip Semiconductor Device, Chip Therefor and Method of Formation Thereof; U.S. Appl. No. 09/377,486, filed Aug. 20, 1999.

Notice of Reason of Rejection, dated Jan. 28, 2005, issued by Japanese Patent Office, for Japanese Patent Application No. 2003-013919, and English-language translation thereof.

* cited by examiner

*Primary Examiner*—Evan Pert
*Assistant Examiner*—Ben P Sandvik
(74) *Attorney, Agent, or Firm*—Finnegan, Henderson, Farabow, Garrett & Dunner, L.L.P.

(57) ABSTRACT

Disclosed is a semiconductor device including: a semiconductor substrate; a plurality of diffusion layer patterns formed on the semiconductor substrate; an insulation film formed between the plural diffusion layer patterns on the semiconductor substrate; and a through plug formed to be partly surrounded by the insulation film without being in contact with the plural diffusion layer patterns and to pass through the insulation film and the semiconductor substrate. Further disclosed is a semiconductor device including: a semiconductor substrate; a plurality of diffusion layer patterns formed on the semiconductor substrate; an insulation film formed between the plural diffusion layer patterns on the semiconductor substrate; and a through plug formed to be partly surrounded by the diffusion layer pattern without being in contact with the insulation film and to pass through the diffusion layer pattern and the semiconductor substrate.

22 Claims, 8 Drawing Sheets

SEMICONDUCTOR DEVICE

CROSS REFERENCE TO RELATED APPLICATIONS

This application is based upon and claims the benefit of priority from the prior Japanese Patent Application No. 2003-13919, filed on Jan. 22, 2003; the entire contents of which are incorporated herein by reference.

BACKGROUND

1. Field of the Invention

The present invention relates to a semiconductor device having through plugs, more particularly, to a semiconductor device in which highly reliable through plugs are formed with good productivity.

2. Description of the Related Art

In accordance with the reduction in size and weight of electronic equipment such as portable devices and mobile devices, downsizing and higher-density design are being demanded also for electronic components constituting the electronic equipment. As one of such electronic components, used is a stacked-type semiconductor device (multichip device) in which semiconductor integrated circuit chips (LSI chips) are three-dimensionally stacked.

Among multichip devices, a structure with the highest integration degree and thus allowing downsizing is such a type of multichip device having a three-dimensionally stacked structure in which through plugs are formed through semiconductor substrates having semiconductor devices formed thereon. In this type of device, the through plugs electrically connecting a face of the semiconductor substrate in which elements are formed to a rear face side are formed. The through plug is constituted of an insulating material covering a sidewall of a through hole and a low electrical resistance metal material (for example, Al, Cu, or the like) in a columnar shape that is positioned so as to be surrounded by the insulating material and that serves as a conductive member. The low resistance of the conductive member ensures the operating performance as a system.

Here, it is more advantageous in view of processes that a through plug forming step is carried out after the completion of a transistor forming step called a frontend process which requires a relatively high-temperature process, in other words, during a multilayer interconnection forming step that is a backend process. Usable methods of forming through holes in which the through plugs are to be formed are reactive ion etching (RIE) using plasma, which is anisotropic etching, and wet etching using an etchant of an alkali solution.

An example of a semiconductor device fabrication method including a through hole forming step is a method described in a patent document: Japanese Patent Laid-open Application No. Hei 10-223833.

SUMMARY

A semiconductor device according to an aspect of the present invention includes: a semiconductor substrate; a plurality of diffusion layer patterns formed on the semiconductor substrate; an insulation film formed between the plural diffusion layer patterns on the semiconductor substrate; and a through plug formed to be partly surrounded by the insulation film without being in contact with the plural diffusion layer patterns and to pass through the insulation film and the semiconductor substrate.

A semiconductor device according to another aspect of the present invention includes: a semiconductor substrate; a plurality of diffusion layer patterns formed on the semiconductor substrate; an insulation film formed between the plural diffusion layer patterns on the semiconductor substrate; and a through plug formed to be partly surrounded by the diffusion layer pattern without being in contact with the insulation film and to pass through the diffusion layer pattern and the semiconductor substrate.

A semiconductor device according to still another aspect of the present invention includes: a plurality of semiconductor chips, at least one of the semiconductor chips including a semiconductor substrate, a plurality of diffusion layer patterns formed on the semiconductor substrate, an insulation film formed between the plural diffusion layer patterns on the semiconductor substrate, and a through plug formed to be partly surrounded by the insulation film without being in contact with the plural diffusion layer patterns and to pass through the insulation film and the semiconductor substrate, or a through plug formed to be partly surrounded by the diffusion layer pattern without being in contact with the insulation film and to pass through the diffusion layer pattern and the semiconductor substrate; and a connecting portion electrically connecting the through plugs of the at least one of the plural semiconductor chips to a semiconductor chip of the plural semiconductor chips other than the at least one of the plural semiconductor chips.

DETAILED DESCRIPTION

Explanation on Embodiments

The above-mentioned document does not disclose in detail the relationship between a through hole and various kinds of patterns formed on a semiconductor substrate. Therefore, it is not clear what kind of measures should be taken in consideration of productivity and reliability when patterns of insulating materials of various kinds, lower layer metal wiring, diffusion layers, and so on are formed on the substrate in which the through hole is to be formed.

For example, if these various kinds of materials need to be individually etched before a semiconductor substrate portion is etched to form the through hole, the throughput is lowered and shape control becomes difficult.

According to the above-described aspects of the present invention, a semiconductor device having through plugs is provided, in which highly reliable through plugs are formed with good productivity.

As a result of forming a through hole in which a through plug (a portion including a conductive member formed to pass through the semiconductor substrate in a thickness direction) is to be formed by etching a semiconductor substrate having various kinds of patterns thereon, the inventor of the present invention has found out that there are some cases where it is not possible to obtain a predetermined through hole shape due to the variation in etching speed and etching shape depending on, for example, the patterns on the semiconductor substrate or dopant concentration.

Figure 8A:
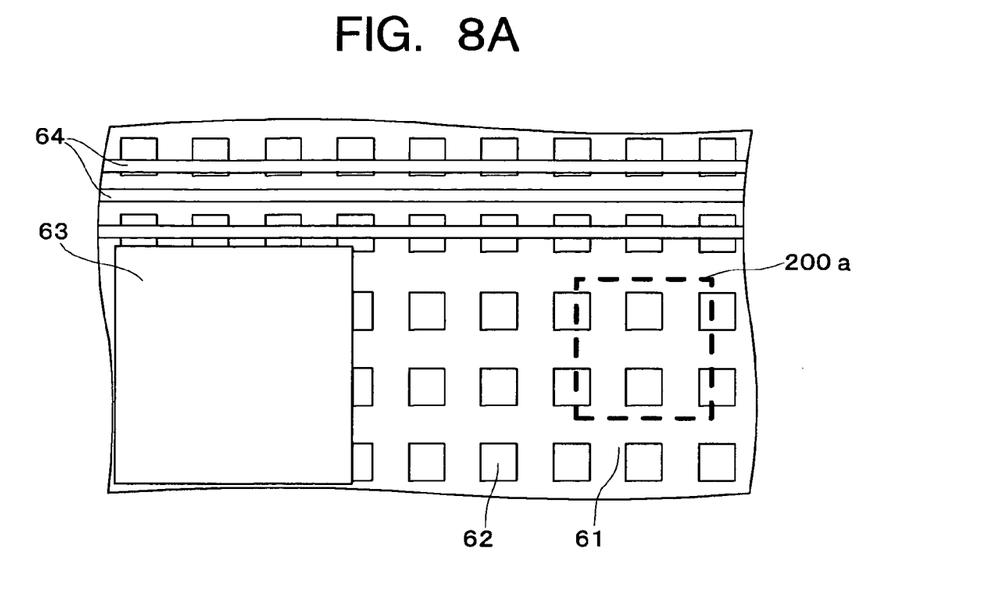
FIG. 8A and FIG. 8B are top views showing states immediately before and immediately after a hole for a through plug is formed in a semiconductor device, as a comparison and reference example, while it is undergoing a backend process.

FIG. 8A is a top view (comparison and reference example) showing a state immediately before a hole for a through plug is formed in a semiconductor device while it is undergoing a backend process. In this state, an STI (shallow trench isolation) insulation film 61 is formed on a semiconductor substrate so as to isolate a plurality of dummy diffusion layers 62 from one another, and wiring patterns 64 and a pad 63 are formed of conductive materials on further upper layer thereof. The dummy diffusion layers 62 are simply dummies in the vicinity of the region shown in the drawing, but in other regions, they constitute part of transistors and so on that are elements of a semiconductor integrated device. Note that interlayer insulation films are interposed in an area from the STI insulation film 61 and the dummy diffusion layers 62 to the wiring patterns 64 and the pad 63, but they are omitted in the drawing. Further, not-shown metal silicide layers are formed on the dummy diffusion layers 62.

Figure 8B:
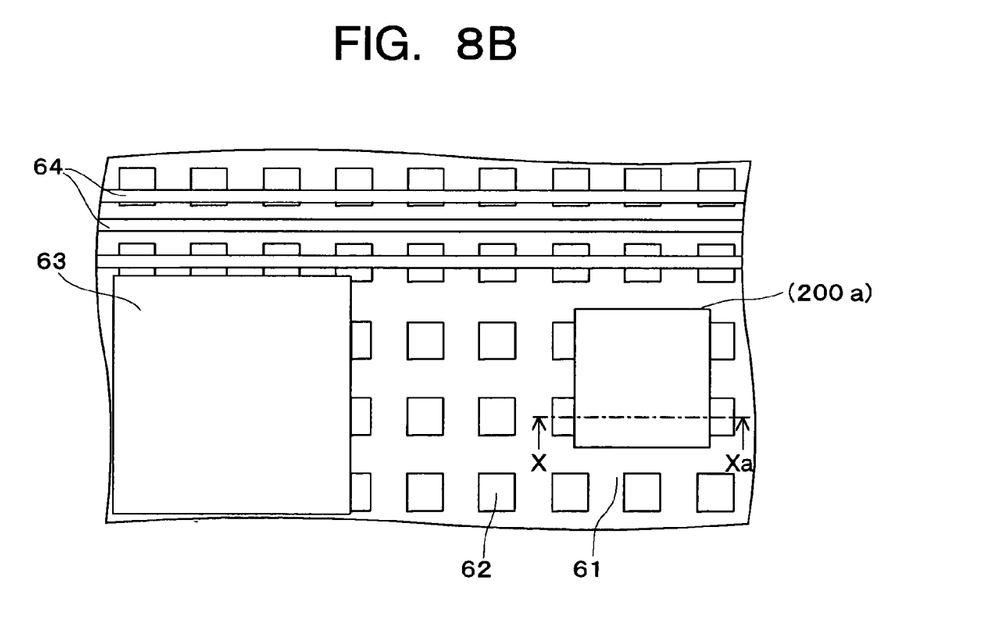

In FIG. 8A, when a hole in which the through plug is to be formed is formed by RIE in, for example, a place 200*a* where the STI insulation film 61 and the dummy diffusion layers 62 exist, since the diameter of the through plug is generally determined so as to dominate the size of the dummy diffusion layers 62 and the adjacent intervals between the dummy diffusion layers 62, the state as shown in FIG. 8B is obtained after the hole is formed.

Figure 9A:
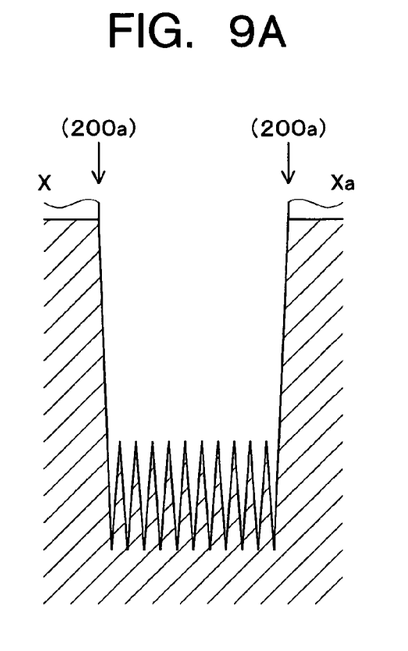
FIG. 9A and FIG. 9B are views showing structure examples of an X-Xa cross section of a formed hole shown in FIG. 8B, seen in the arrow direction.
Figure 9B:
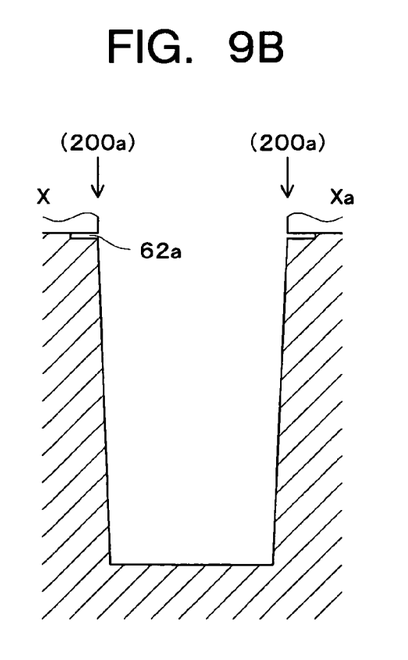

FIG. 9A and FIG. 9B are views showing structure examples of an X-Xa cross section of the formed hole shown in FIG. 8B, seen in the arrow direction. The structure shown in FIG. 9A is the structure when etching for forming the hole is conducted under such conditions that strong anisotropy is maintained. During such etching, side etching does not easily occur since the etching progresses so as to form a protective film on a sidewall.

In such a case, however, the etching speed is not constant in the hole, resulting in a shape having residues on a bottom face of the formed hole as shown in FIG. 9A. This is caused by, for example, difference in level originated from boundaries between the STI insulation film 61 and the dummy diffusion layers 62 inside the hole position and is also caused by residues of dopant of the dummy diffusion layers 62 and residues of metal silicide that is necessary for forming contacts in the dummy diffusion layers 62.

With such a shape of the hole, even when the sidewall is covered with an insulating material thereafter, a conductive member is buried in the hole, and the semiconductor substrate is cut from a rear face side thereof to form the through plug, the resultant shape is inferior as the through plug, which causes a defect in terms of reliability in vertical electrical joint for stacking the semiconductor devices. On the other hand, when etching is conducted under such conditions that the formation of the protective film is not much promoted on the sidewall during the etching in order to avoid the above problem, side etchings 62*a* occur, as shown in FIG. 9B, in dummy diffusion layer regions where the etching speed is faster, so that shape controllability cannot be maintained.

In contrast, according to one aspect of the present invention described above, the through plug is surrounded by the insulation film, out of the diffusion layer patterns and the insulation film formed on the semiconductor substrate, but is not in contact with the diffusion layer patterns. Therefore, in forming an etching hole in which the through plug is to be formed, etching conditions can be determined without any consideration of the occurrence of side etching in the diffusion layer patterns. Consequently, it is made possible to keep the etching speed more constant in the hole, realizing processing with high shape controllability. The processing with high shape controllability is also realized in such a manner that no diffusion layer pattern is disposed from the initial stage in the place where the etching hole is to be formed, thereby keeping the etching speed more constant in the hole. Therefore, it is possible to provide a semiconductor device in which highly reliable through plugs are formed with high productivity.

Alternatively, according to another aspect of the present invention described above, the through plug is surrounded by the diffusion layer pattern out of the diffusion layer patterns and the insulation film formed on the semiconductor substrate, but is not in contact with the insulation film. This means that, in forming the etching hole in which the through plug is to be formed, it is not necessary to etch a place where various kinds of films are formed, but a place where a uniform film is formed can be etched. This makes it possible to keep the etching speed more constant in the hole, realizing processing with high shape controllability. Therefore, it is possible to provide a semiconductor device in which highly reliable through plugs are formed with good productivity.

According to still another aspect of the present invention, the structures according to each of the above-described aspects are actually assembled into a stacked structure.

A semiconductor device as a form of an embodiment of the present invention may further include a pattern portion formed above the diffusion layer pattern and/or the insulation film without being in contact with the through plug, the pattern portion using as a material thereof one kind selected from a group consisting of aluminum (Al), tungsten (W), titanium (Ti), copper (Cu), tantalum (Ta), and a chemical compound composed of at least one metal out of aluminum (Al), tungsten (W), titanium (Ti), copper (Cu), and tantalum (Ta).

This means that, in a semiconductor device having these pattern portions, the through plug is formed so as to keep clear of positions where the pattern portions are formed. This is because it is disadvantageous in terms of productivity to etch these pattern portions in order to form a hole for the through plug since these pattern portions are more difficult to be etched.

As another form of an embodiment, the semiconductor device may further include a pattern portion formed above the diffusion layer pattern and/or the insulation film, the pattern portion using as a material thereof one kind selected from a group consisting of aluminum (Al), tungsten (W), titanium (Ti), copper (Cu), tantalum (Ta), and a chemical compound composed of at least one metal out of aluminum (Al), tungsten (W), titanium (Ti), copper (Cu), and tantalum (Ta), and the through plug may be also surrounded also by the pattern portion above the diffusion layer pattern and/or the insulation film.

In this case, in the semiconductor device having these pattern portions, a place in a uniform state where the pattern portion is formed can be etched at the time of forming an etching hole in which the through plug is to be formed. Therefore, the etching speed can be kept more constant in the hole, which enables processing with high shape controllability.

The semiconductor device according to one aspect of the present invention described above can be fabricated in such a manner that the STI is formed on the semiconductor substrate to demarcate regions to be the diffusion layer patterns in portions where the STI is not formed, the semiconductor substrate is processed to form therein a through plug forming hole having a contour line embraced within the region of the STI, and the through plug is formed in the through plug forming hole.

The semiconductor device according to another aspect described above can be fabricated in such a manner that the STI is formed on the semiconductor substrate to demarcate regions to be the diffusion layer patterns in portions where the STI is not formed, the semiconductor substrate is processed to form therein a through plug forming hole having a contour line embraced within the region of the diffusion layer pattern, and the through plug is formed in the through plug forming hole.

In either one of the methods, the contour line of the through plug forming hole is embraced within the region in a uniform state such as the STI insulation film (or diffusion layer pattern). Therefore, the state inside the contour line before etching can be made uniform, or if the state cannot be made uniform the etching conditions can be set so as to allow etching at a substantially constant speed. Consequently, the etching speed can be kept more constant in the hole, which enables processing with high shape controllability.

Figure 1A:
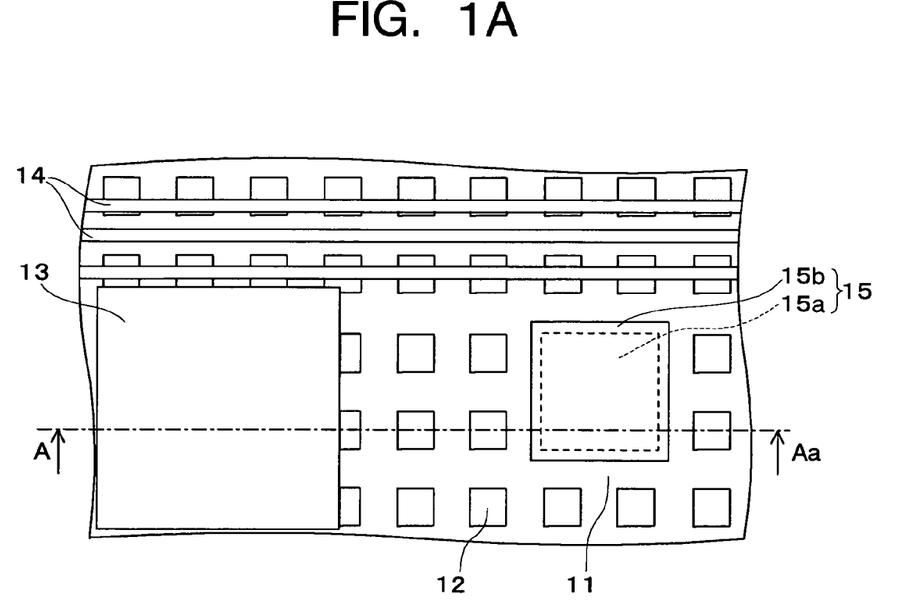
FIG. 1A and FIG. 1B are views schematically showing the structure of a semiconductor device according to an embodiment of the present invention.
Figure 1B:
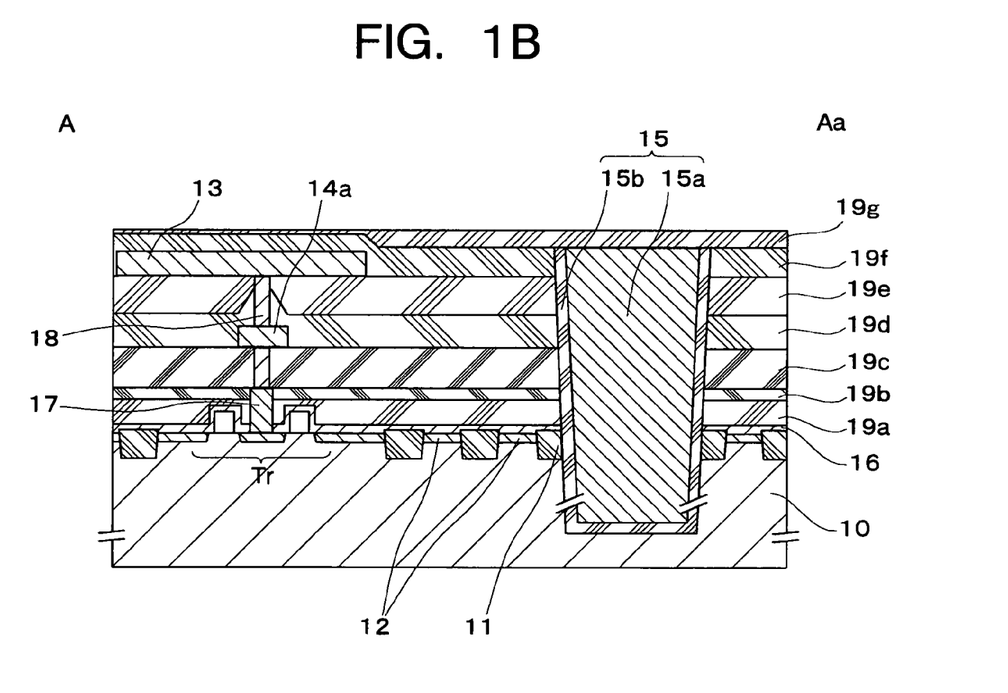

Based on the foregoing, embodiments of the present invention will be hereinafter explained with reference to the drawings. FIG. 1A and FIG. 1B are views schematically showing the structure of a semiconductor device (semiconductor chip) according to an embodiment of the present invention. FIG. 1A is a top view and FIG. 1B is a view showing an A-Aa cross section in FIG. 1A, seen in the arrow direction. Note that a stopper film 16 and interlayer insulation films 19a to 19g are omitted in FIG. 1A.

Normally, in an integrated semiconductor device, for example, an integrated device of MOS FET transistors, there are an STI as a field oxide film and active areas including diffusion layer regions on a semiconductor (Si) substrate, the active areas having gate structures of transistors formed thereon, and multilayer wiring is formed further above the STI and active areas. FIG. 1A and FIG. 1B show the state in which a through plug is formed in a backend process in such a semiconductor device.

As shown in FIG. 1A and FIG. 1B, an STI insulation film 11 is formed on a semiconductor substrate 10 so as to insulate a plurality of dummy diffusion layers 12 from one another, and wiring patterns 14 and a pad 13 are further formed of conductive materials above the STI insulation film 11 and the dummy diffusion layers 12. The stopper film 16 and the interlayer insulation films 19a, 19b, . . . are interposed in an area from the STI insulation film 11 and the dummy diffusion layers 12 to the wiring patterns 14 and the pad 13.

The diffusion layer regions and an electrode of a transistor Tr formed in the active area are electrically connected to a lower wiring pattern 14a, the pad 13, an upper wiring pattern 14, and so on by a contact plug 17 and an interlayer via plug 18. Note that metal silicide layers can be formed on the diffusion layer regions and the electrode of this transistor Tr and on dummy diffusion layers 12, when necessary. Usable materials for forming the upper and lower wiring patterns 14, 14a and the pad 13 are aluminum (Al), tungsten (W), titanium (Ti), copper (Cu), tantalum (Ta), or a chemical compound (for example, silicide or the like) composed of at least any one of these metals.

A through plug 15 is positioned so as to be surrounded by the STI insulation film 11 in the vicinity of the surface of the semiconductor substrate 10, and vertically passes through the semiconductor substrate 10, the STI insulation film 11, the stopper film 16, and the interlayer insulation films 19a to 19f. The through plug 15 is constituted of a columnar electric conductor 15a (Cu is an example of its material) and an insulation layer 15b (silicon oxide, silicon nitride, or the combination of these is an example of its material) surrounding the electric conductor 15a. In order to actually make the through plug 15 function as an electrically conductive member, the semiconductor substrate 10 is hereafter cut from a rear face side thereof to expose a bottom portion of the electric conductor 15a, and on an upper face side, the interlayer insulation film 19g is partly etched for removal to expose the electric conductor 15a. Then, necessary electric connection is made on these exposed surfaces.

Figure 1C:
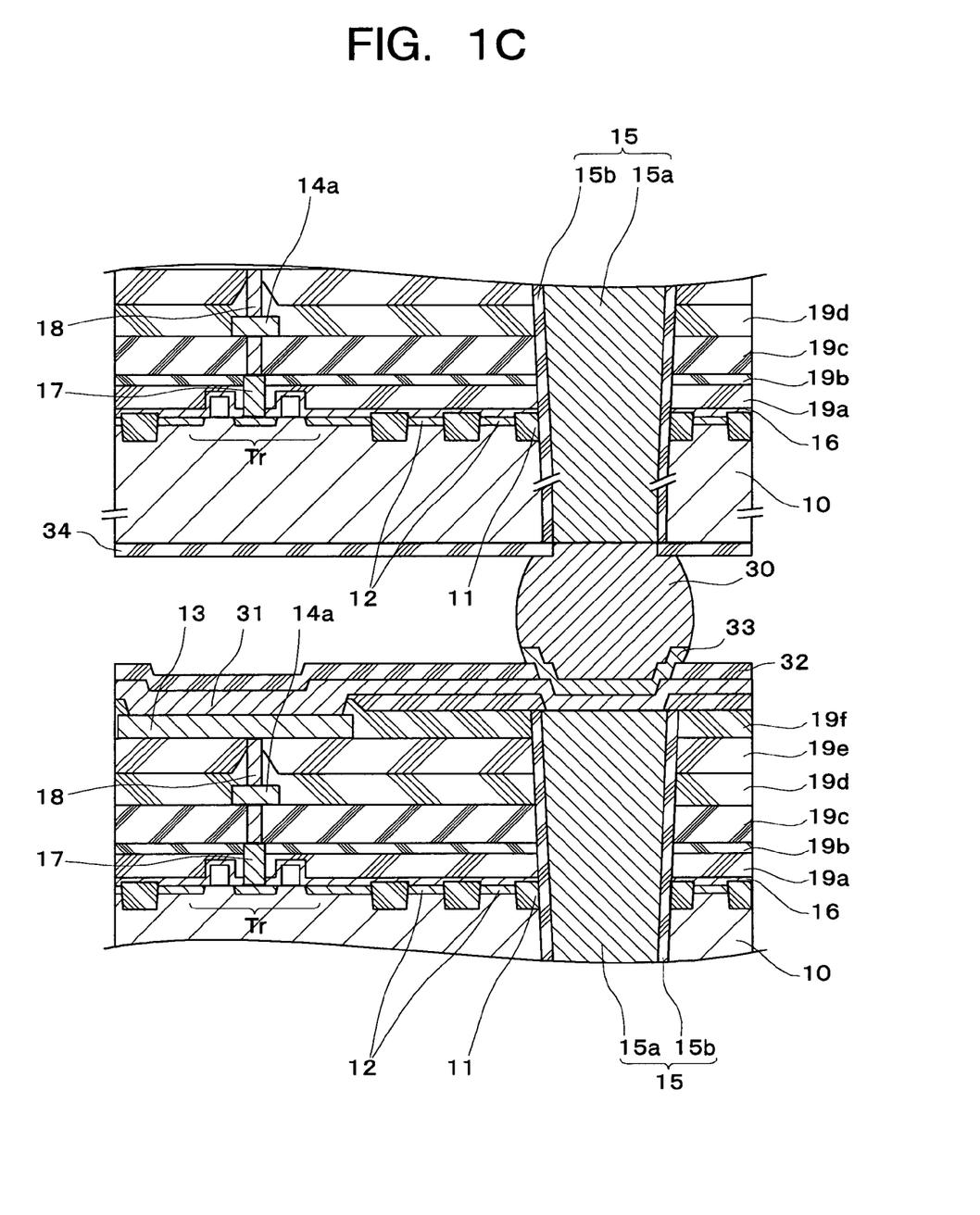
FIG. 1C is a schematic structural view of a cross section, showing a structure example in which the semiconductor devices according to this embodiment are stacked.

FIG. 1C is a schematic structural view of a cross section showing a structure example in which semiconductor devices formed by such a method are stacked. In FIG. 1C, the same reference numerals and symbols are used to designate the same portions as the portions shown in FIG. 1B. As shown in FIG. 1C, the electric conductors 15a of the through plugs 15 are adequately connected electrically to the pad 13 via a rewiring layer 31 (Al is an example of its material), and are electrically and mechanically connected to each other in the vertical direction by a connecting member 30 such as solder. After they are thus connected, remaining gaps and so on are filled with, for example, a sealant. Note that the reference numeral 32 denotes a passivation film formed on an upper most face except vertical connecting portions by the connecting member 30, the reference numeral 33 denotes a barrier metal film preventing the connecting member 30 from diffusing, and the reference numeral 34 denotes a insulating film formed on a back surface of the semiconductor substrate 10.

In FIG. 1B and FIG. 1C, the actual dimensions are such that, for example, the thickness of the semiconductor substrate 10 is several hundreds μm, the distance from a height position where the STI insulation film 11 is formed up to an upper most face is 2 μm to 3 μm, the height of the through plug 15 is 50 μm to 100 μm, and the diameter (one side) thereof is about 20 μm. Further, in FIG. 1A, the horizontal width of the STI insulation film 11 surrounding the through plug 15 is nominally about 2 μm or more at the narrowest portion thereof. With this degree of the width, it is possible to fully prevent the through plug 15 from being in contact with the dummy diffusion layers 12 even if deviation in the formation position of the through plug 15 occurs.

An RIE method using, for example, a fluorine gas can be used for forming a hole for the through plug 15 by etching in the above-described semiconductor device. With the fluorine gas, the etching rate for metal such as Al, W, and Cu is slow.

Therefore, in this embodiment, etching holes are formed in places where the wiring patterns 14, 14*a* and the pad 13, which are made of metal, are not formed. Consequently, it is not necessary to suffer such a demerit that different etching apparatuses and etching conditions have to be used for etching respective layers, namely, for etching of metal, etching of the insulation film, and etching of Si. Further, this structure is also effective for solving a productivity problem of throughput drop and a problem of difficulty in shape control.

Figure 2A:
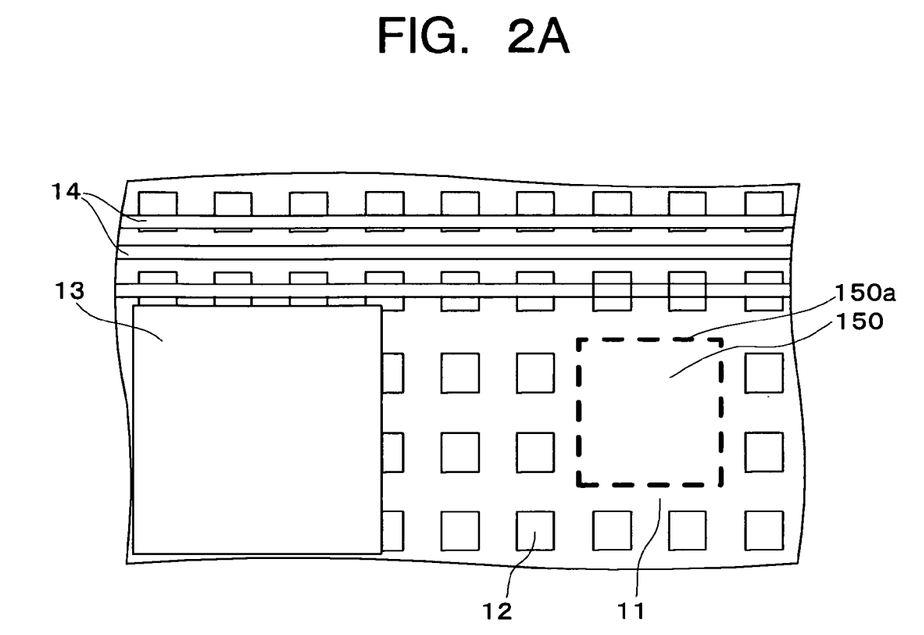
FIG. 2A and FIG. 2B are a top view (FIG. 2A) schematically showing an example of a state before a through plug 15 is formed in the semiconductor device shown in FIG. 1A and FIG. 1B, and a view (FIG. 2B) schematically showing an example of a cross section of a hole formed by etching the inside of a contour line 150a shown in FIG. 2A.

FIG. 2A is a top view schematically showing an example of a state before the through plug 15 is formed in the semiconductor device shown in FIG. 1A and FIG. 1B. In FIG. 2A, the same reference numerals and symbols are used to designate portions which are the same as or corresponding to the portions in FIG. 1A and FIG. 1B.

In this case, as shown in FIG. 2A, neither the metal wirings nor the patterns of the dummy diffusion layers 12 are disposed in a place 150 (inside the contour line 150*a*) where the through plug 15 is to be formed, but a region of a field oxide film being the STI insulation film 11 is disposed therein. An example of a cross section of a hole formed by etching the inside of the contour line 150*a* in this case is schematically shown in FIG. 2B.

Figure 2B:
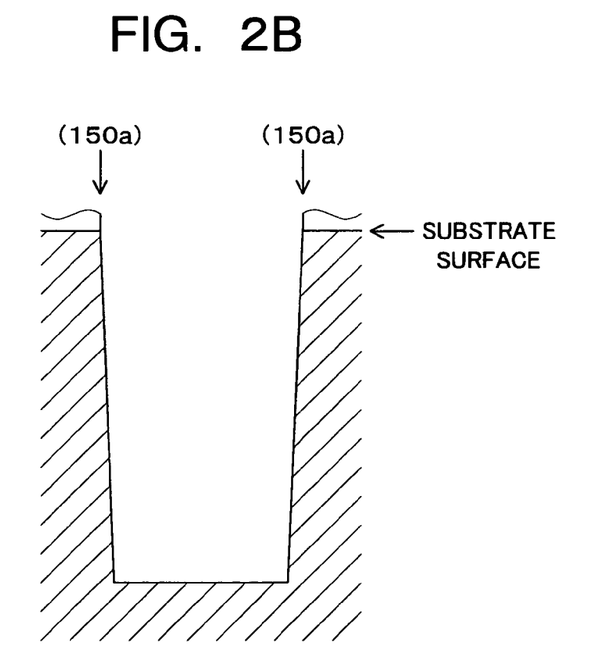

As shown in FIG. 2B, even when the etching is conducted under such conditions that protective film formation on a sidewall is much promoted for selectivity to an etching mask and for control of the etching shape, no residue or the like occurs on a bottom face since the material of the place where the hole is formed is uniform and in addition, since there exists no dopant or no metal silicide both originated from the dummy diffusion layers 12. Therefore, when the through plug 15 is formed in this hole, the through plug 15 in good shape and with high reliability is obtainable.

Figure 3:
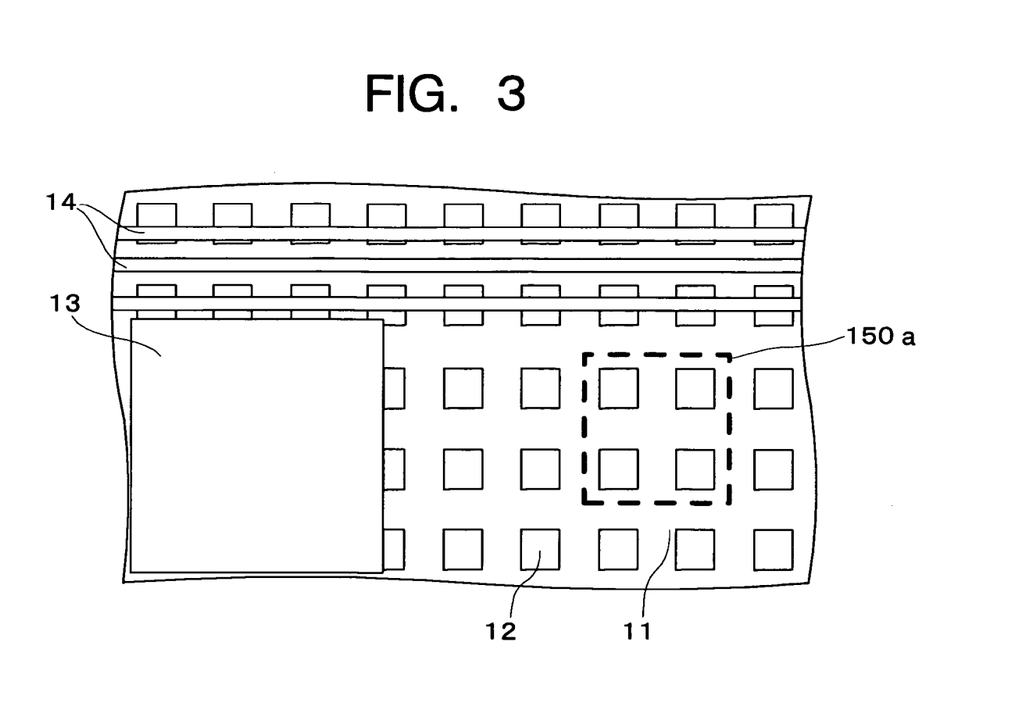
FIG. 3 is a top view schematically showing another example of the state before the through plug 15 is formed in the semiconductor device shown in FIG. 1A and FIG. 1B.

Next, another example of the state before the through plug 15 is formed in the semiconductor device shown in FIG. 1A and FIG. 1B will be explained with reference to FIG. 3. FIG. 3 is a top view schematically showing another example of the state before the through plug 15 is formed. In FIG. 3, the same reference numerals and symbols are used to designate portions which are the same as or corresponding to the portions in FIG. 2A.

In this example, as shown in FIG. 3, the position of the etching hole is selected in a region where the dummy diffusion layers 12 are regularly disposed so that the contour line 150*a* of the etching hole is embraced within the region of the STI insulation film 11. Generally, the dummy diffusion layers 12 are provided in order to ensure polishing uniformity in a processed surface at the time of removing, by a CMP (chemical mechanical polishing) method, a part of a top face side of an oxide film once deposited, when the STI insulation film 11 is formed. Therefore, this structure can improve uniformity in the surface when the STI insulation film 11 is formed, compared with the already-explained STI insulation film 11 and patterns of the dummy diffusion layers 12 as shown in FIG. 2A.

Incidentally, this structure may possibly cause the formation of a level difference and so forth, which are originated from the boundaries between the dummy diffusion layers 12 and the STI insulation film 11, on a bottom portion of the etching hole, thereby causing the formation of residues on the bottom portion as in the conventional example, but the use of etching conditions under which the formation of the sidewall protective film is not much promoted can eliminate this problem.

In the example shown in FIG. 3, even when the etching is conducted under such conditions that the formation of the sidewall protective film is not much promoted, no such problem arises that undercuts occur along the dummy diffusion layers 12 as shown in FIG. 9B. This is because the position of the etching hole is selected so that the contour line 150*a* of the etching hole is embraced within the region of the STI insulation film 11 and thus the dummy diffusion layers 12 are exposed to an etchant from no direction. Therefore, the structure in this example also makes it possible to form the through plug 15 in good shape and to improve reliability in the connection by the through plug 15.

Figure 4:
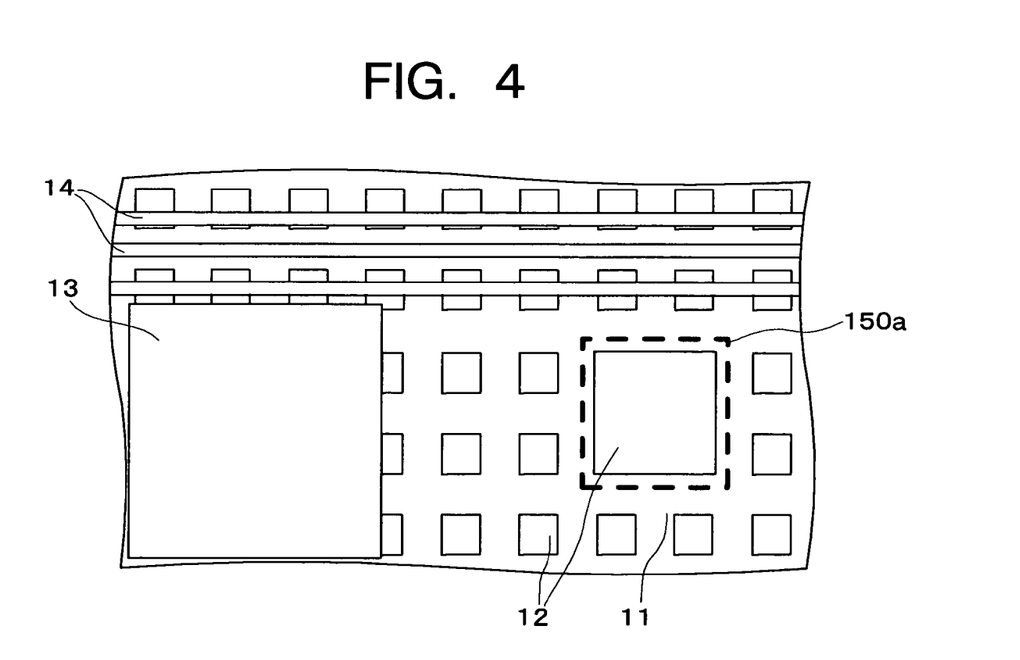
FIG. 4 is a top view schematically showing still another example of the state before the through plug 15 is formed in the semiconductor device shown in FIG. 1A and FIG. 1B.

Next, still another example of the state before the through plug 15 is formed in the semiconductor device shown in FIG. 1A and FIG. 1B will be explained with reference to FIG. 4. FIG. 4 is a top view schematically showing still another example of the state before the through plug 15 is formed. In FIG. 4, the same reference numerals and symbols are used to designate portions which are the same as or corresponding to the portions in FIG. 2A.

In this example, as shown in FIG. 4, the position of the etching hole is selected so that the contour line 150*a* of the etching hole surrounds the dummy diffusion layer 12 larger in area than the dummy diffusion layers 12 disposed therearound and is embraced within the region of the STI insulation film 11. With this structure, even when the level difference is caused by the STI insulation film 11, the residues are not easily formed on the bottom portion since the level difference is constant in the vicinity of the periphery of the etching hole. Therefore, the structure in this example also makes it possible to form the through plug 15 in good shape and to improve reliability in the connection by the through plug.

Figure 5:
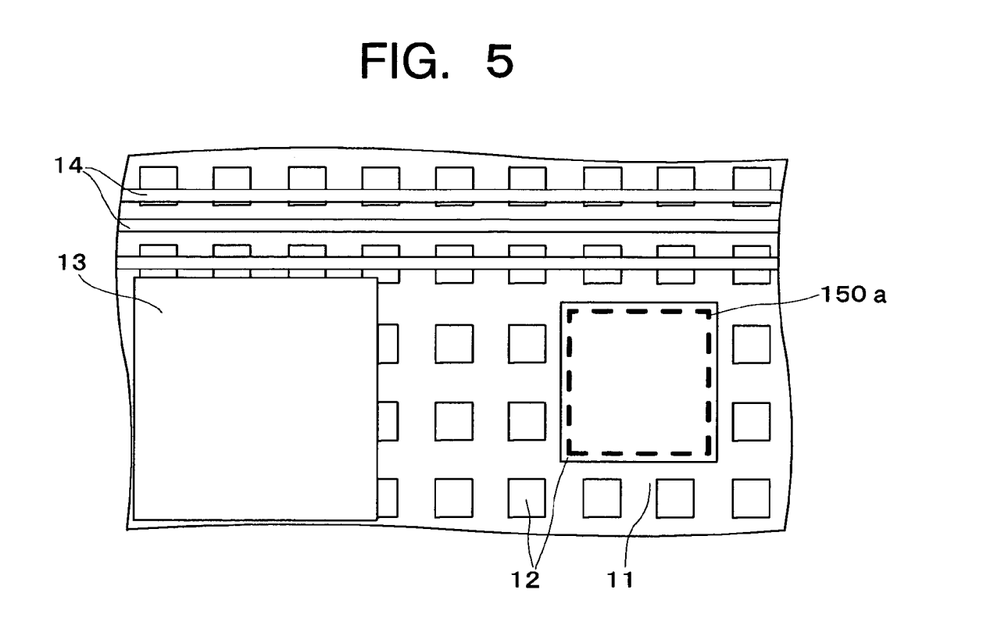
FIG. 5 is a top view schematically showing yet another example of the state before the through plug 15 is formed.

Next, yet another example of the state before the through plug 15 is formed will be explained with reference to FIG. 5. FIG. 5 is a top view schematically showing yet another example of the state before the through plug 15 is formed. In FIG. 5, the same reference numerals and symbols are used to designate portions which are the same as or corresponding to the portions in FIG. 2A.

In this example, as shown in FIG. 5, the position of the etching hole is selected so that the contour line 150*a* of the etching hole is embraced within the region of the dummy diffusion layer 12 larger in area than the dummy diffusion layers 12 disposed therearound. In this case, if the conditions under which the formation of the sidewall protective film is not much promoted are used for etching, undercuts occur in the dummy diffusion layer 12 (the dummy diffusion layer 12 having a larger area). However, this dummy diffusion layer 12 is surrounded by the field oxide film being the STI insulation film 11, and therefore, by controlling the positional relationship between this larger dummy diffusion layer 12 and the contour line 150*a* of the etching hole, an amount of this undercut can be controlled, which prevents unexpected deformation of the shape.

Figure 6:
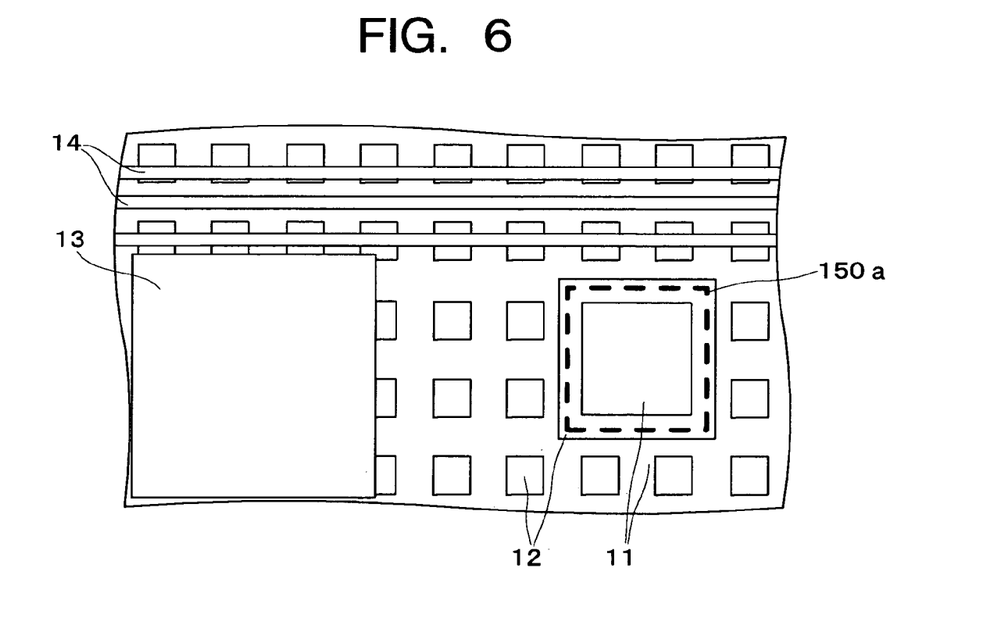
FIG. 6 is a top view schematically showing yet another example of the state before the through plug 15 is formed.

If an amount of the undercut can be controlled, the shape control is made possible by, for example, etching and removing a film positioned on an upper face of the undercut after the etching hole is formed. Further, since the material of the place where the hole is formed is uniform, it is possible to reduce the formation of the residues, which results from the level difference caused by the STI insulation film 11, on the bottom face of the etching hole. This also applies to the case when, as shown in FIG. 6, the dummy diffusion layer 12 is formed in a frame shape and the contour line 150*a* of the etching hole is selected so as to be embraced within a region of this frame-shaped dummy diffusion layer 12. FIG. 6 is a top view schematically showing yet another example of the state before the through plug 15 is formed, and the same reference numerals and symbols are used to designate portions which are the same as or corresponding to those in FIG. 2A.

Figure 7A:
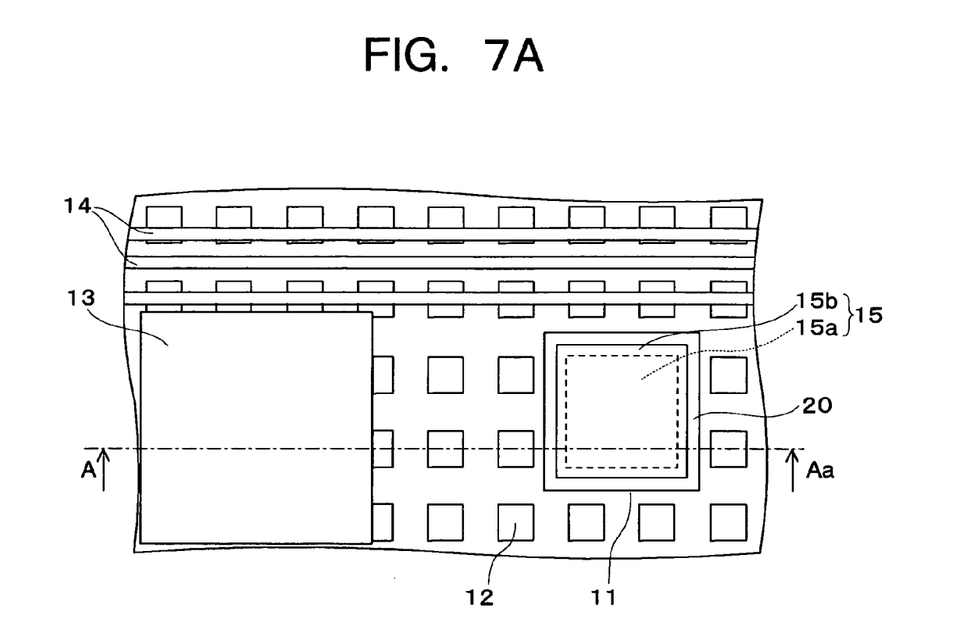
FIG. 7A and FIG. 7B are views schematically showing the structure of a semiconductor device according to another embodiment of the present invention.
Figure 7B:
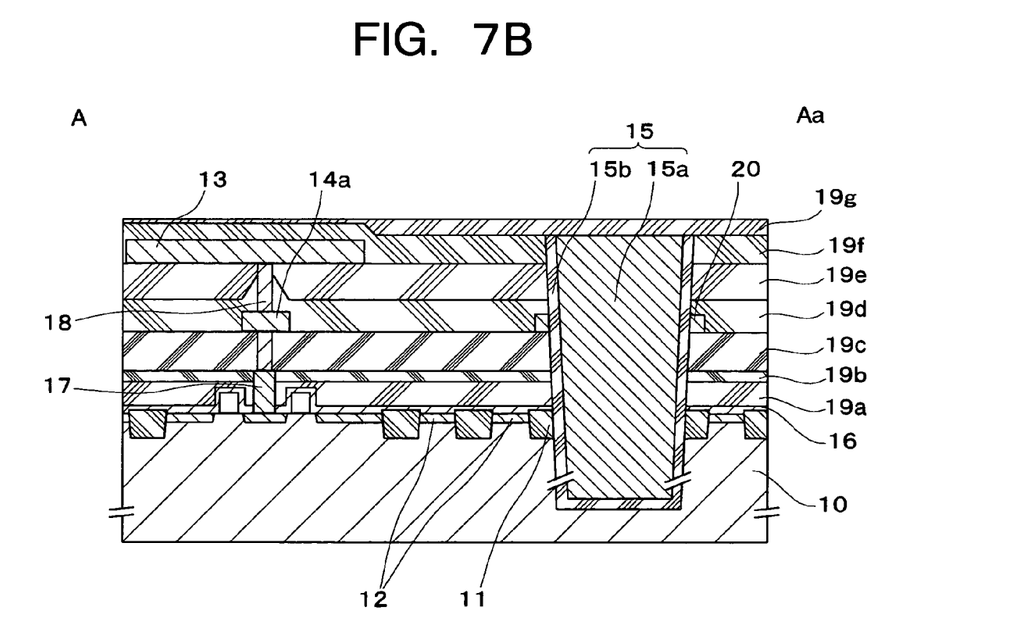

Next, a semiconductor device according to another embodiment of the present invention will be explained with reference to FIG. 7A and FIG. 7B. FIG. 7A and FIG. 7B are views schematically showing the structure of the semiconductor device according to another embodiment of the present invention. FIG. 7A is a top view and FIG. 7B is a view showing an A-Aa cross section in FIG. 7A, seen in the arrow direction. In FIG. 7A and FIG. 7B, the same reference numerals and symbols are used to designate portion which are the same as or corresponding to the portions already explained in FIG. 1A and FIG. 1B, and the relationship among these portions are also the same.

In this embodiment, a formed through plug 15 is surrounded also by a wiring pattern (a lower wiring pattern in this example) 20 inside interlayer insulation films 19a to 19g. This is what makes this embodiment different from the embodiment shown in FIG. 1A and FIG. 1B. The wiring pattern 20 is a dummy wiring pattern and is disposed in order to obtain uniformity in the forming process of a layer including this pattern.

In such formation of the through plug 15 surrounded by the wiring pattern 20, possible shapes of the wiring pattern 20 before an etching hole is formed are the same shape as that of the large dummy diffusion layer 12 shown in FIG. 5 or the frame-shaped dummy diffusion layer 12 shown in FIG. 6. Therefore, even when special conditions are required for etching this wiring pattern 20, the occurrence of the residues on the bottom portion of the etching hole can be effectively reduced. This is because the material of the bottom portion of the etching hole is substantially uniform in each layer.

Therefore, the structure in this example also makes it possible to form the through plug 15 in good shape and to improve reliability in the connection by the through plug 15. Incidentally, this embodiment shown in FIG. 7A and FIG. 7B shows the example where the through plug 15 is surrounded by the STI insulation film 11 in the vicinity of the surface of the semiconductor substrate 10, but by using the pattern of the dummy diffusion layer 12 as shown in FIG. 5 or FIG. 6, it is made possible to have such a structure that the through plug 15 is surrounded by the dummy diffusion layer 12 in the vicinity of the surface of the semiconductor substrate 10.

It should be understood that the present invention is not limited to the specific forms described above with illustration and all the changes which come within the range of equivalency of the following claims are therefore intended to be embraced therein.

What is claimed is:

1. A semiconductor device comprising:
a semiconductor substrate;
a plurality of diffusion layer patterns formed on the semiconductor substrate;
an insulation film formed between the diffusion layer patterns on the semiconductor substrate to isolate the diffusion layer patterns from one another; and
a through plug formed to have a side surface being in contact with one of the diffusion layer patterns, the side surface being surrounded by the one of the diffusion layer patterns without being in contact with the insulation film, and to pass through the one of the diffusion layer patterns and the semiconductor substrate.

2. A semiconductor device as set forth in claim 1, further comprising a pattern portion formed above the diffusion layer patterns and/or the insulation film without being in contact with the through plug, the pattern portion using as a material thereof one kind selected from a group consisting of aluminum (Al), tungsten (W), titanium (Ti), copper (Cu), tantalum (Ta), and a chemical compound composed of at least one metal out of aluminum (Al), tungsten (W), titanium (Ti), copper (Cu), and tantalum (Ta).

3. A semiconductor device as set forth in claim 1, further comprising a pattern portion formed above the diffusion layer patterns and/or the insulation film, the pattern portion using as a material thereof one kind selected from a group consisting of aluminum (Al), tungsten (W), titanium (Ti), copper (Cu), tantalum (Ta), and a chemical compound composed of at least one metal out of aluminum (Al), tungsten (W), titanium (Ti), copper (Cu), and tantalum (Ta),
wherein the through plug is partly surrounded also by the pattern portion above the plurality of diffusion layer patterns and/or the insulation film.

4. A semiconductor device as set forth in claim 1, wherein each of the diffusion layer patterns has a metal silicide layer.

5. A semiconductor device as set forth in claim 1, wherein the through plug has a columnar electric conductor made of copper and an insulation layer made of any one of silicon oxide, silicon nitride, and a combination of silicon oxide and silicon nitride, the insulation layer surrounding the columnar electric conductor.

6. A semiconductor device as set forth in claim 1, wherein a diameter of the through plug is larger than an interval between adjacent ones of the diffusion layer patterns.

7. A semiconductor device as set forth in claim 1, wherein the diffusion layer patterns are dummy diffusion layer patterns.

8. A semiconductor device comprising:
a semiconductor substrate;
a plurality of diffusion layer patterns formed on the semiconductor substrate;
an insulation film formed between the diffusion layer patterns on the semiconductor substrate to isolate the diffusion layer patterns from one another;
a pattern portion formed above the diffusion layer patterns and/or the insulation film, the pattern portion using as a material thereof one kind selected from a group consisting of aluminum (Al), tungsten (W), titanium (Ti), copper (Cu), tantalum (Ta), and a chemical compound composed of at least one metal out of aluminum (Al), tungsten (W), titanium (Ti), copper (Cu), and tantalum (Ta); and
a through plug formed to have a side surface being in contact with the insulation film, the side surface being surrounded by the insulation film without being in contact with the diffusion layer patterns, and to pass through the insulation film and the semiconductor substrate, the through plug being partly surrounded by the pattern portion above the diffusion layer patterns and/or the insulation film and being insulated from the pattern portion.

9. A semiconductor device as set forth in claim 8, further comprising another pattern portion formed above the diffusion layer patterns and/or the insulation film without being in contact with the through plug, the pattern portion using as a material thereof one kind selected from a group consisting of aluminum (Al), tungsten (W), titanium (Ti), copper (Cu), tantalum (Ta), and a chemical compound composed of at least one metal out of aluminum (Al), tungsten (W), titanium (Ti), copper (Cu), and tantalum (Ta).

10. A semiconductor device as set forth in claim 8, wherein each of the diffusion layer patterns has a metal silicide layer.

11. A semiconductor device as set forth in claim 8, wherein the through plug has a columnar electric conductor made of copper and an insulation layer made of any one of silicon oxide, silicon nitride, and a combination of silicon oxide and silicon nitride, the insulation layer surrounding the columnar electric conductor.

12. A semiconductor device as set forth in claim 8, wherein a diameter of the through plug is larger than an interval between adjacent ones of the diffusion layer patterns.

13. A semiconductor device as set forth in claim 8, wherein a diameter of the through plug is larger than a size of at least one of the diffusion layer patterns.

14. A semiconductor device as set forth in claim 8, wherein the diffusion layer patterns are dummy diffusion layer patterns.

15. A semiconductor device as set forth in claim 8, further comprising an interlayer insulation film formed under the pattern portion and over the semiconductor substrate.

16. A semiconductor device comprising:
a plurality of semiconductor chips, at least one of the semiconductor chips including:
a semiconductor substrate;
a plurality of diffusion layer patterns formed on the semiconductor substrate;
an insulation film formed between the diffusion layer patterns on the semiconductor substrate to isolate the diffusion layer patterns from one another;
a pattern portion formed above the diffusion layer patterns and/or the insulation film, the pattern portion using as a material thereof one kind selected from a group consisting of aluminum (Al), tungsten (W), titanium (Ti), copper (Cu), tantalum (Ta), and a chemical compound composed of at least one metal out of aluminum (Al), tungsten (W), titanium (Ti), copper (Cu), and tantalum (Ta); and
a through plug formed to have a side surface being in contact with the insulation film, the side surface being surrounded by the insulation film without being in contact with the diffusion layer patterns, and to pass through the insulation film and the semiconductor substrate, the through plug being partly surrounded by the pattern portion above the diffusion layer patterns and/or the insulation film and being insulated from the pattern portion, or a through plug formed to have a side surface being in contact with one of the diffusion layer patterns, the side surface being surrounded by the one of the diffusion layer patterns without being in contact with the insulation film, and to pass through the one of the diffusion layer patterns and the semiconductor substrate; and
a connecting member electrically connecting the through plugs of the at least one of the semiconductor chips to at least one of the semiconductor chips.

17. A semiconductor device as set forth in claim 16,
wherein the at least one of the semiconductor chips further comprises another pattern portion formed above the diffusion layer patterns and/or the insulation film without being in contact with the through plug, the pattern portion using as a material thereof one kind selected from a group consisting of aluminum (Al), tungsten (W), titanium (Ti), copper (Cu), tantalum (Ta), and a chemical compound composed of at least one metal out of aluminum (Al), tungsten (W), titanium (Ti), copper (Cu), and tantalum (Ta).

18. A semiconductor device as set forth in claim 16, wherein each of the diffusion layer patterns has a metal silicide layer.

19. A semiconductor device as set forth in claim 16, wherein the through plug has a columnar electric conductor made of copper and an insulation layer made of any one of silicon oxide, silicon nitride, and a combination of silicon oxide and silicon nitride, the insulation layer surrounding the columnar electric conductor.

20. A semiconductor device as set forth in claim 16, wherein a diameter of the through plug is larger than an interval between adjacent ones of the diffusion layer patterns.

21. A semiconductor device as set forth in claim 16,
wherein the through plug is formed to have the side surface being in contact with the insulation film, the side surface being surrounded by the insulation film without being in contact with the diffusion layer patterns, and to pass through the insulation film and the semiconductor substrate, the through plug being partly surrounded by the pattern portion above the diffusion layer patterns and/or the insulation film and being insulated from the pattern portion, and
wherein a diameter of the through plug is larger than a size of at least one of the diffusion layer patterns.

22. A semiconductor device as set forth in claim 16, wherein at least one of the diffusion layer patterns of the at least one of the semiconductor chips is a dummy diffusion layer pattern.

* * * * *